(12) United States Patent
Fan

(10) Patent No.: US 9,661,742 B2
(45) Date of Patent: May 23, 2017

(54) PRINTED CIRCUIT BOARD AND DRIVING METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventor: Po-Hsiang Fan, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/016,400

(22) Filed: Feb. 5, 2016

(65) Prior Publication Data
US 2017/0071057 A1 Mar. 9, 2017

(30) Foreign Application Priority Data
Sep. 7, 2015 (CN) ...................... 2015 2 0686899 U

(51) Int. Cl.
H05K 1/02 (2006.01)
H01B 5/02 (2006.01)
H01G 5/00 (2006.01)

(52) U.S. Cl.
CPC .................... H05K 1/0265 (2013.01)

(58) Field of Classification Search
CPC .......... H02G 3/0431; H02G 5/00; H02G 5/06; H02G 5/005; H02G 5/007; H02G 5/025

USPC ...... 174/68.2, 72 B, 81 B, 88 B, 70 B, 99 B, 174/129 B, 133 B, 149 B; 361/661, 624, 361/637, 639
See application file for complete search history.

(56) References Cited

U.S. PATENT DOCUMENTS

| | | | | |
|---|---|---|---|---|
| 5,434,749 A | * | 7/1995 | Nakayama | H01R 12/62 174/261 |
| 5,877,944 A | * | 3/1999 | Onizuka | H01H 85/20 361/644 |
| 6,049,043 A | * | 4/2000 | Tonejc | H01H 50/047 174/250 |
| 2006/0048968 A1 | * | 3/2006 | Chen | H02M 7/003 174/257 |

* cited by examiner

Primary Examiner — Hoa C Nguyen
(74) Attorney, Agent, or Firm — Li & Cai Intellectual Property (USA) Office

(57) ABSTRACT

A printed circuit board is disclosed, comprising a plate body, a conductive pattern disposed on the plate body, a conductive metal plate, and a metal layer. The conductive metal plate has a first terminal and a second terminal, wherein the first terminal and the second terminal are fixed to the plate body. An accommodating space is between the conductive metal plate and the plate body. The metal layer covers the conductive metal plate and the conductive pattern, and is filled into the accommodating space. Therefore, a printed circuit board which has metal blocks with enough thickness is provided. The metal blocks can provide sufficiently low resistance to increase resistance efficiency of the printed circuit.

9 Claims, 8 Drawing Sheets

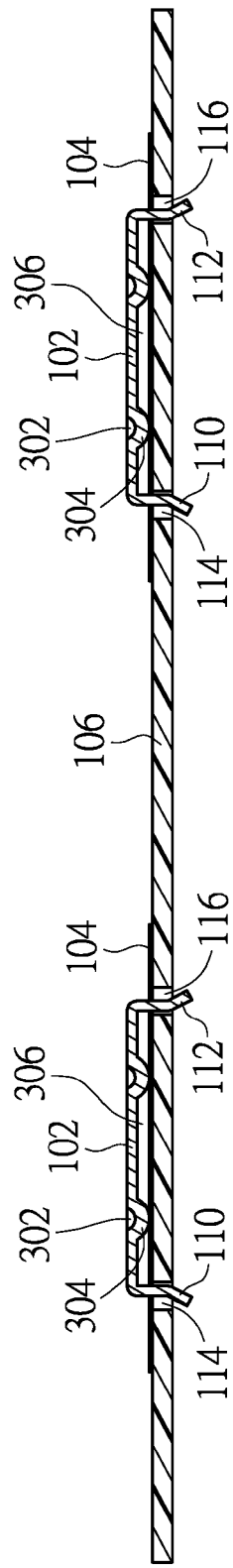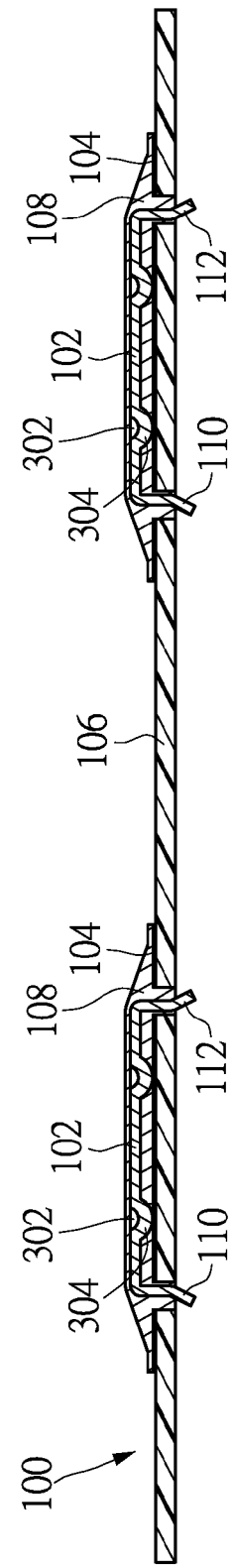

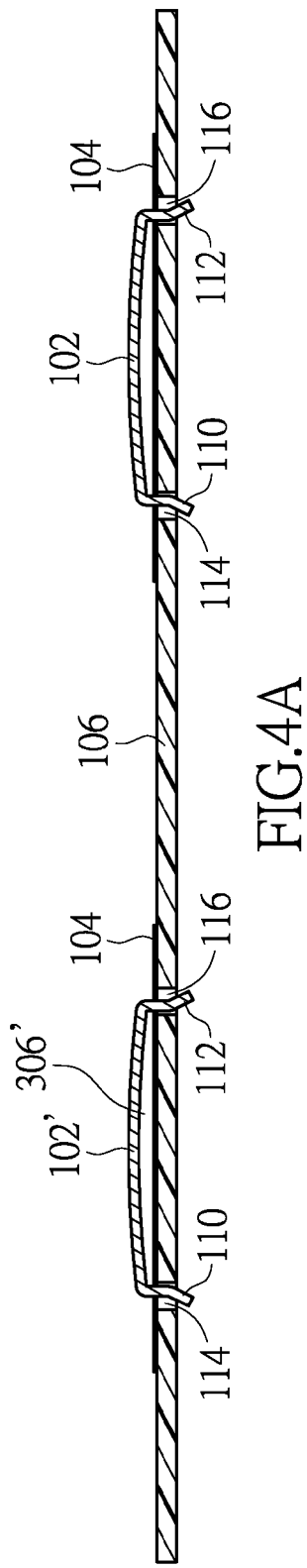
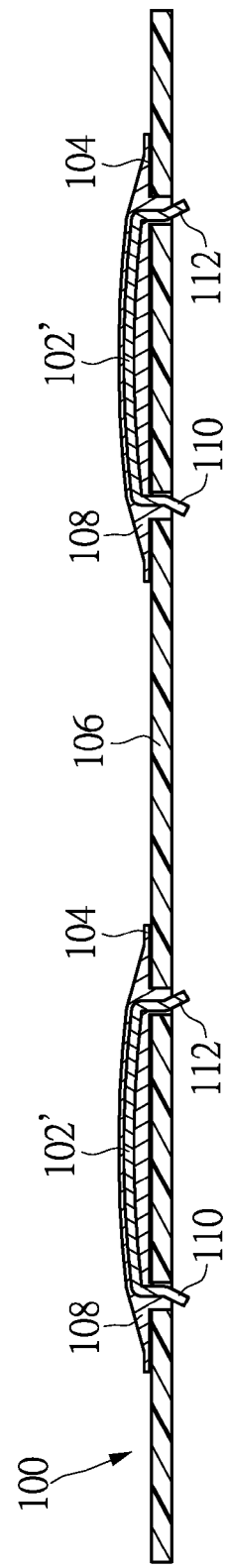

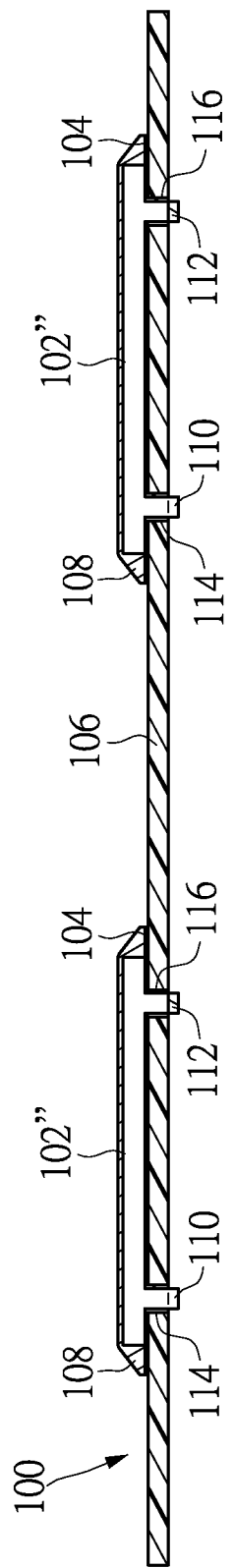

PRINTED CIRCUIT BOARD AND DRIVING METHOD THEREOF

BACKGROUND OF THE DISCLOSURE

1. Field of the Disclosure

The instant disclosure relates to a printed circuit board; in particular, to a printed circuit board applied with large current.

2. Description of Related Art

Computer equipment has a power supply to transfer input alternating current having voltage 110V or 220V to direct current having voltage 12V or ±5V required by mother boards, hard drives and optical disk drives. As well, power supplies are computer power transferring equipment responsible for transferring alternating current to stable low voltage direct current which can be used by other parts of computers. Because different parts require different voltages, power supplies must provide a plurality of direct voltages to be used by each part of computers.

The power supply has a printed circuit board which is generally called a backboard. Most devices are directly disposed on the backboard, and the current power supply is developed as a large power set. However, the circuit or the conducting area passing the large current of the backboard cannot provide low enough resistance. Therefore, the amount of devices in product increases and design of these products becomes more and more difficult.

Therefore, the applicant has developed a product to solve the issues described above.

SUMMARY OF THE DISCLOSURE

The objective of the instant disclosure is to provide a printed circuit board which can provide metal blocks with enough thickness. Therefore, the metal blocks can provide sufficiently low resistance to increase resistance efficiency of the printed circuit.

In order to achieve the aforementioned objectives, according to an embodiment of the instant disclosure, a printed circuit board is disclosed, comprising a plate body, a conductive pattern disposed on the plate body, a conductive metal plate, and a metal layer. The conductive metal plate has a first terminal and a second terminal, wherein the first terminal and the second terminal are fixed to the plate body. An accommodating space is between the conductive metal plate and the plate body. The metal layer covers the conductive metal plate and the conductive pattern, and is filled into the accommodating space.

The instant disclosure further provides a printed circuit board, comprising a plate body, a conductive pattern disposed on the plate body, a conductive metal plate, and a metal layer covering the conductive metal plate and the conductive pattern. The conductive metal plate has a first terminal and a second terminal, wherein the first terminal and the second terminal are fixed to the plate body. The conductive metal plate is perpendicular to the plate body.

The instant disclosure further provides a printed circuit board, comprising a plate body, a conductive pattern disposed on the plate body, a conductive metal plate, and a metal layer. The conductive metal plate has a first terminal and a second terminal, wherein the first terminal and the second terminal are fixed to the plate body, and the metal layer covers the conductive metal plate and the conductive pattern.

According to the description above, the instant disclosure has the benefits as follows. The technique provided by the instant disclosure which comprises fastening a conductive metal plate to a conductive pattern and forming a metal layer thereon can form the metal layer comprising the conductive pattern, the conductive metal plate and the metal layer with sufficiently low resistance to increase resistance efficiency of the printed circuit board. In addition, some embodiments of the instant disclosure form an accommodating space between the conductive metal plate and the plate body. A furnace passing procedure is performed to form a metal layer. During this procedure, the metal layer fills the accommodating space between the conductive metal plate and the plate body due to capillarity, and the metal layer covers the surface of the conductive metal plate and the conductive pattern. Therefore, a metal block comprising the metal layer, the conductive metal plate and a conductive pattern with sufficient large thickness is formed. Therefore, the metal block can provide sufficiently low resistance to increase resistance efficiency of the printed circuit board.

In order to further understand the instant disclosure, the following embodiments and illustrations are provided. However, the detailed description and drawings are merely illustrative of the disclosure, rather than limiting the scope being defined by the appended claims and equivalents thereof.

BRIEF DESCRIPTION OF THE DRAWINGS

FIG. 3B shows a cross section of the printed circuit board at an intermediate stage of an embodiment of the instant disclosure.

FIG. 3C shows a cross section of the printed circuit board of an embodiment of the instant disclosure.

FIG. 4A shows a cross section of the printed circuit board at an intermediate stage of an embodiment of the instant disclosure.

FIG. 4B shows a cross section of the printed circuit board of an embodiment of the instant disclosure.

FIG. 5B shows a cross section of the printed circuit board of an embodiment of the instant disclosure.

DETAILED DESCRIPTION OF THE PREFERRED EMBODIMENTS

The aforementioned illustrations and detailed descriptions are exemplary for the purpose of further explaining the scope of the instant disclosure. Other objectives and advantages related to the instant disclosure will be illustrated in the subsequent descriptions and appended drawings.

First Embodiment

Figure 1A:
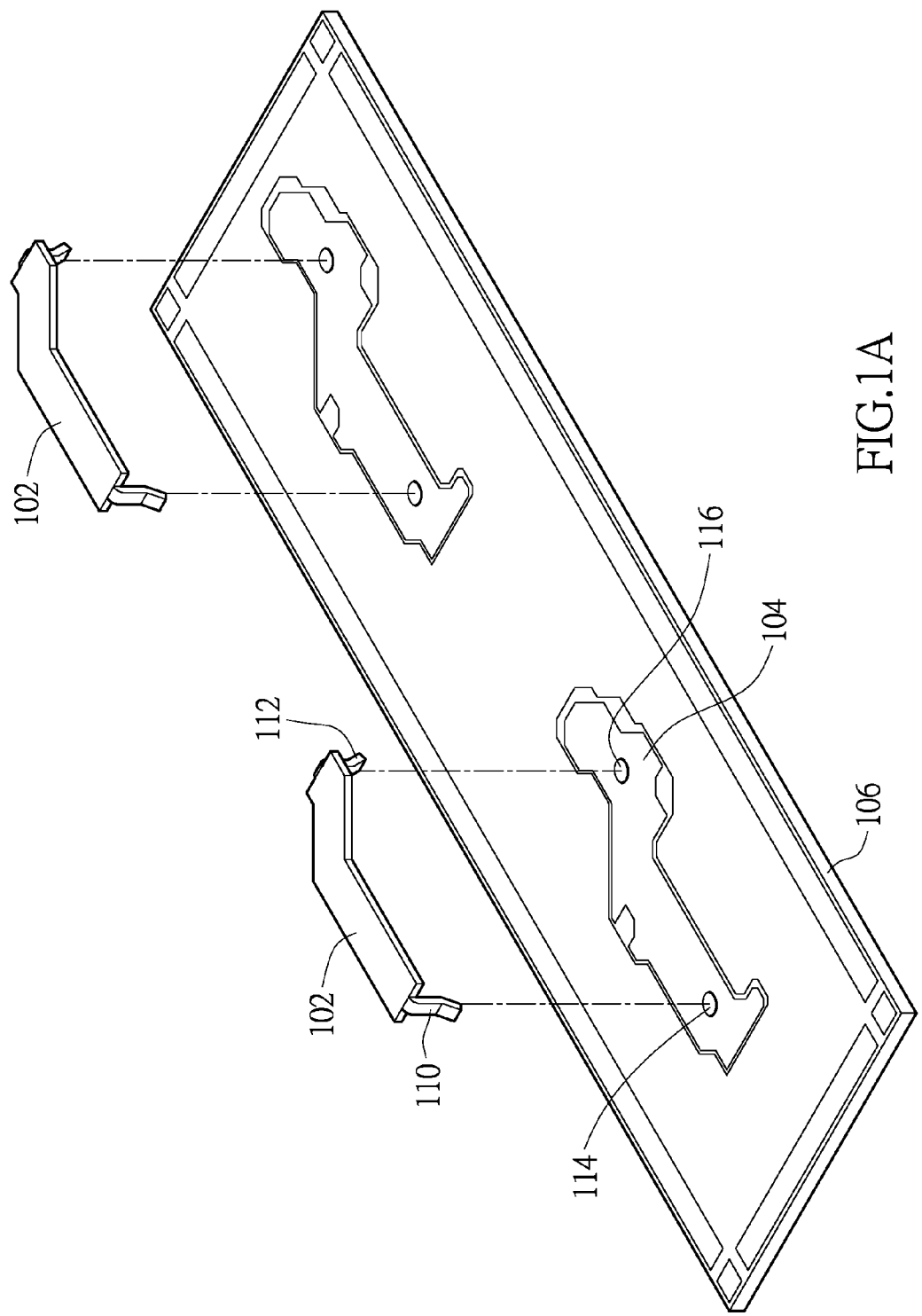
FIG. 1A shows an exploded view of the printed circuit board of an embodiment of the instant disclosure.
Figure 1B:
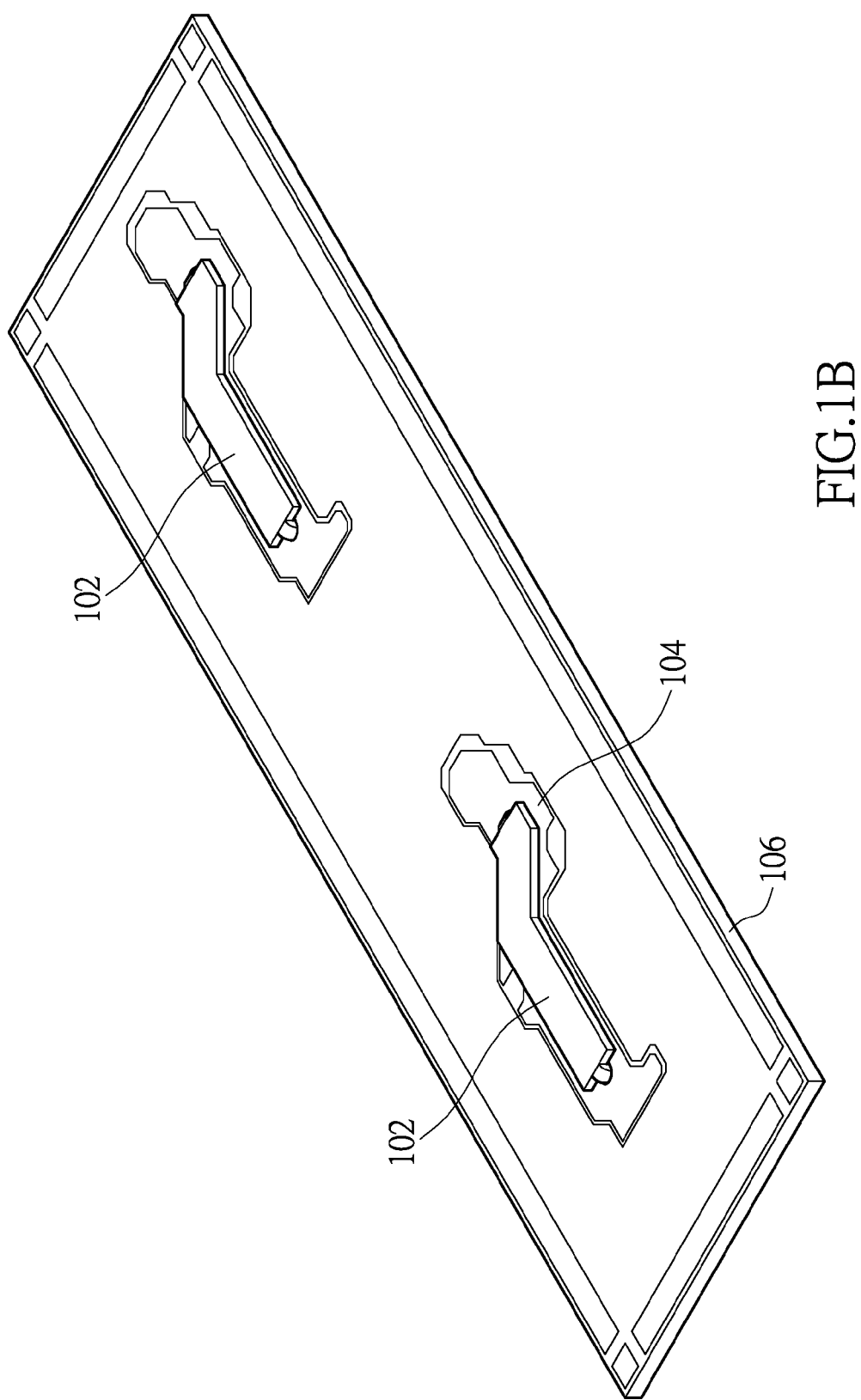
FIG. 1B shows a three dimensional view of the printed circuit board at an intermediate stage of an embodiment of the instant disclosure.
Figure 2A:
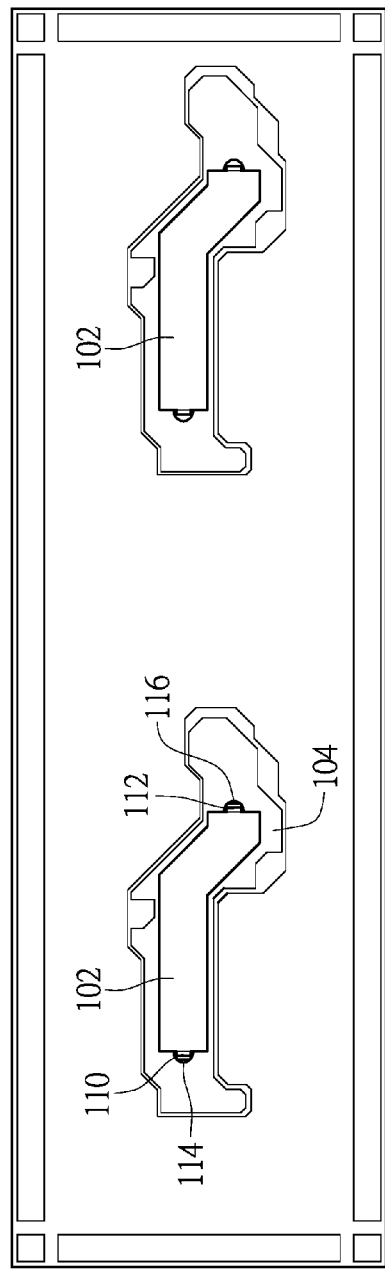
FIG. 2A shows a plane view of the printed circuit board at an intermediate stage of an embodiment of the instant disclosure.
Figure 2B:
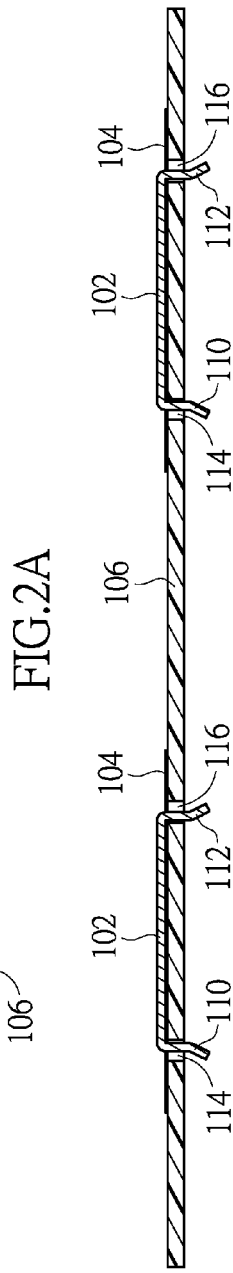
FIG. 2B shows a cross section of the printed circuit board at an intermediate stage of an embodiment of the instant disclosure.

FIG. 1A shows an exploded view of the printed circuit board of an embodiment of the instant disclosure. FIG. 1B shows a three dimensional view of the printed circuit board at an intermediate stage of an embodiment of the instant disclosure. First, referring to FIG. 1A, the instant disclosure provides a printed circuit board comprising a plate body 106, a conductive pattern 104 disposed on the plate body 106 and a conductive metal plate 102 having a first terminal and a second terminal, and the first terminal and the second terminal of the conductive metal plate 102 are fixed to the plate body 106. Please refer to FIG. 1A and FIG. 1B and also FIG. 2A and FIG. 2B, wherein FIG. 2A shows a plane view of the printed circuit board at an intermediate stage, and FIG. 2B shows a cross section of the printed circuit board at an intermediate stage. The plate body 106 has a first hole 114 and a second hole 116. The first terminal of the conductive metal plate 102 has a first fastening part 110, the second terminal of the conductive metal plate 102 has a second fastening part 110, the first fastening part 112 is fastened to the first hole 114, and the second fastening part 112 is fastened to the second hole 116. However, the disclosure is not limited to the described method, combining the conductive metal plate 102 and the plate body 106 through fastening. The conductive metal plate 102 and the plate body 106 can be combined using other ways, such as adhering or welding, but the mentioned method is required to fit the process temperature of the metal layer formed thereafter. For example, if an adhering method is used, the adhering material is required to endure the temperature of forming the metal layer to avoid shifting between the conductive metal plate and the plate body or being dropped out of the conductive metal plate.

Figure 2C:
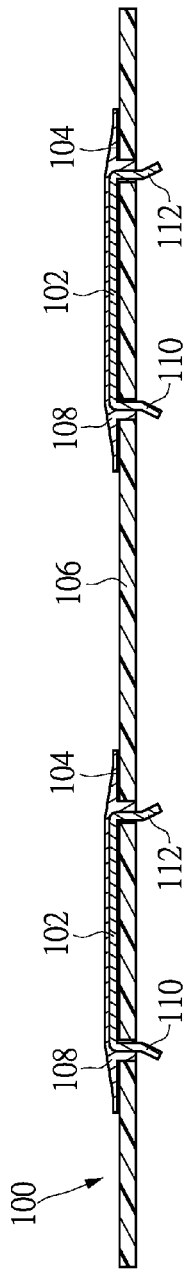
FIG. 2C shows a cross section of the printed circuit board of an embodiment of the instant disclosure.

As shown in FIG. 1A, FIG. 1B and FIG. 2A, shape of the conductive metal plate 102 is similar to shape of the conductive pattern 104 in the embodiment. It is noted that after the conductive metal plate 102 adhering to the plate body 106, the conductive metal plate 102 does not extend out of the range of the conductive pattern 104 in an embodiment. This will be discussed in more detail thereafter. However, the instant disclosure is not limited thereto. In the embodiment, the conductive metal plate 102 is a copper member or an iron plate which is tinned at a surface thereon. Therefore, the metal layer formed of tin can be adhered to the conductive metal plate. The printed circuit board 100 can be used as a backboard of a power supply, and the conductive pattern 104 can be used to be passed with large current. The conductive pattern 104 of the embodiment can be a tin layer. The final structure of the embodiment is shown in FIG. 2C, using the method of passing tin furnace to form a metal layer 108 on the conductive pattern 104 and the conductive metal plate 102. In the embodiment, the metal layer 108 is formed of tin. The object for jointing a conductive metal plate 102 on the conductive pattern 104 of the plate body 106 is to form a metal block having enough thickness. The metal block formed with the conductive pattern 104, the conductive metal plate 102 and the metal layer 108 can provide sufficient low resistance to increase resistance efficiency of the printed circuit board 100. In addition, the reason why the conductive metal plate 102 cannot exceed the range of the conductive pattern 104 after the conductive metal plate 102 is bonded with the plate body 106 is that if the conductive metal plate 102 exceeds the range of the conductive pattern 104, the metal layer 108 will form out of the range when conducting a passing tin furnace procedure. Therefore, the metal layer 108 will overlap with other conductive lines and electronic devices on the plate body 106, and short circuit issues occur and the printed circuit board 100 works abnormally.

The printed circuit board 100 of the embodiment specifically suits a backboard of a power supply because the requirement of wattage of the power supply continually increases, and the backboard must be able to pass a large current. Therefore, it is necessary for a specific area to provide sufficient low resistance. In an example, the output power of the power supply is 400~1000 Watt. However, the instant disclosure is not limited thereto. The printed circuit board 100 can also be used for other devices.

Second Embodiment

Figure 3A:
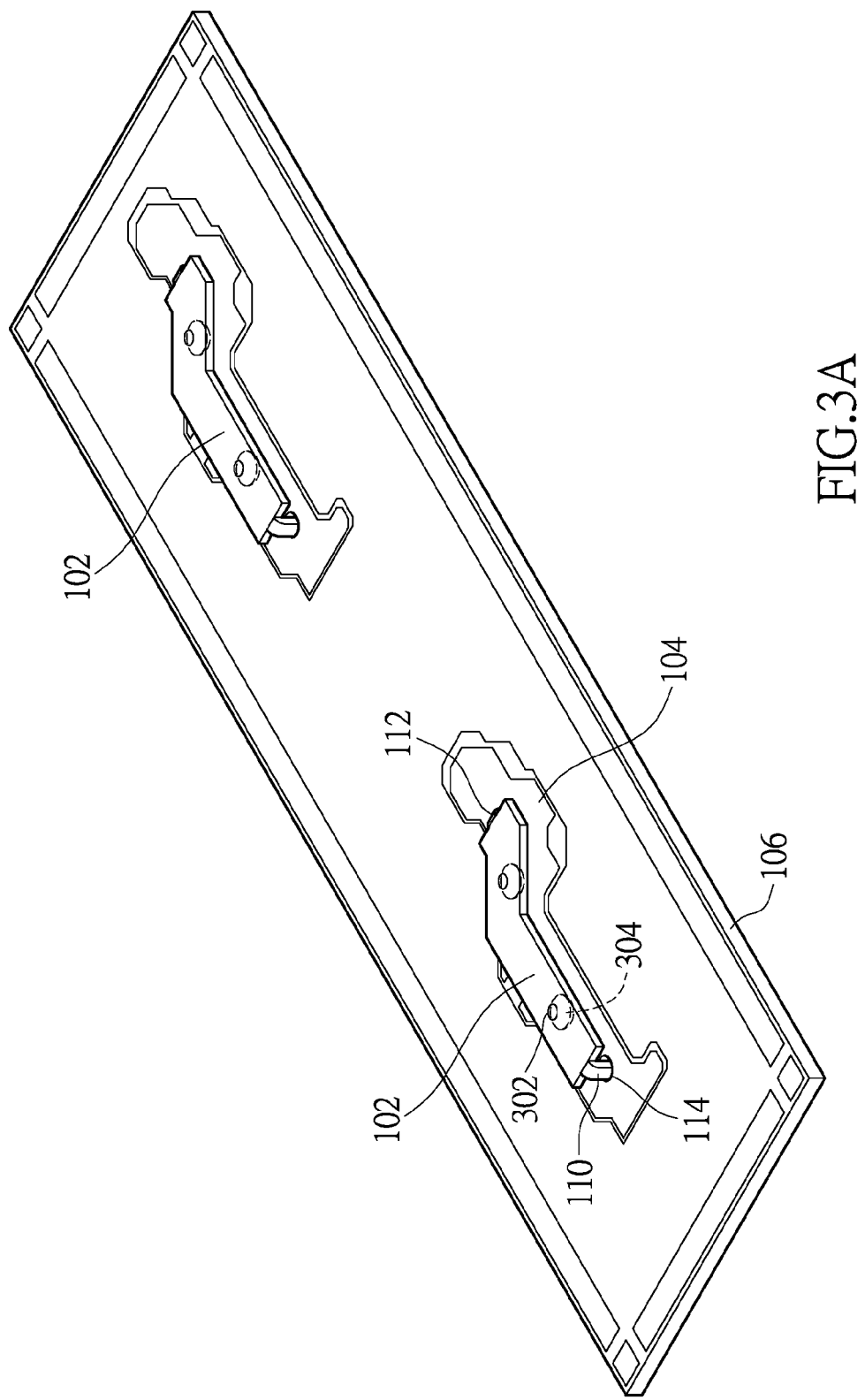
FIG. 3A shows a plane view of the printed circuit board at an intermediate stage of an embodiment of the instant disclosure.

FIG. 3A shows a three dimensional view of a printed circuit board at an intermediate fabrication stage of the embodiment. FIG. 3B shows a cross section view of a printed circuit board at an intermediate fabrication stage of the embodiment. FIG. 3C shows a cross section view of a printed circuit board at final stage. The difference between this embodiment and the first embodiment is that an accommodating space 306 is formed between the conductive metal plate 102 and the plate body 106. The embodiment uses printing method to form a cavity 302 on the conductive metal plate 102 and form a bump 304 under the conductive metal plate 102. Because the bump 304 abuts against the plate body 106 of the printed circuit board 100, the conductive metal plate 102 is separated from the plate body 106 by a distance to form an accommodating space 306. The other part is like the first embodiment. Like elements use the same symbol and are not described again herein.

After the conductive metal plate 102 joints the plate body 106, referring to FIG. 3C, a furnace passing procedure is performed to form a metal layer 108. During this procedure, the metal layer 108 fills the accommodating space 306 between the conductive metal plate 102 and the plate body 106 due to capillarity. In addition, the metal layer 108 also covers the surface of the conductive metal plate 102 and the conductive pattern 104. Therefore, a metal block comprising the metal layer 108, the conductive metal plate 102 and the conductive pattern 104 with sufficient thick thickness is formed. Furthermore, the metal block of the embodiment is thicker than that of the first embodiment where no accommodating space is formed between the conductive metal plate 102 and the conductive pattern 104. In an example, the metal block has thickness of about 0.5 mm~2 mm so that the metal block can provide sufficiently low resistance to increase resistance efficiency of the printed circuit board 100. It is noted that if the printed circuit 100 board is used for a power supply, the metal layer 108 on the conductive metal plate 102 is required to be separated from the housing of the power supply to avoid a short circuit.

Third Embodiment

FIG. 4A shows a cross section view of a printed circuit board at an intermediate fabrication stage of the embodiment. FIG. 4B shows a cross section view of a printed circuit board at final stage of the embodiment. The embodiment is similar to the second embodiment to form an accommodating space 306' between the conductive metal plate 102' and the plate body 106, but the difference is that the embodiment uses an arc-shaped conductive metal plate 102'. Because the conductive metal plate 102' is arc-shaped, after the first fastening part 110 is fastened to the first hole 114 of the plate body 106 and the second fastening part 112 is fastened to the second hole 116 of the plate body 106, the bottom surface of the conductive metal plate 102' is separated from the top surface of the plate body 106 by a distance. Therefore, an accommodating space 306' is formed between the conductive metal plate 102' and the plate body 106. The bottom side of the accommodating space 306' is a plane, and the top side of the accommodating space 306' is a curved surface. In an example, the distance between the top side of the accommodating space 306' and the bottom side of the accommodating space 306' is 0.3 mm~3.2 mm. Next, referring to FIG. 4B, a furnace passing procedure is performed to form a metal layer 108. During this procedure, the metal layer 108 fills the accommodating space 306' between the conductive metal plate 102' and the plate body 106 due to capillarity. In addition, the metal layer 108 also covers the surface of the conductive metal plate 102' and the conductive pattern 104. Therefore, a metal block comprising the metal layer 108, the conductive metal plate 102' and the conductive pattern 104 with sufficiently thick thickness is formed. In an example, the metal block has thickness of about 0.5 mm~2 mm so that the metal block can provide sufficiently low resistance to increase resistance efficiency of the printed circuit board 100. If the accommodating space 306' between the conductive metal plate 102' and the plate body 106 is larger, the volume of the metal layer filled into the accommodating space 306 becomes greater. Therefore, a thicker metal block comprising the metal layer 108, the conductive metal plate 102' and the conductive pattern 104 is formed, and the lower the resistance of the metal block, the better resistance efficiency of the printed circuit board 100 is provided. It is noted that if the printed circuit board 100 is used for a power supply, the metal layer 108 on the conductive metal plate 102' is required to be separated from the housing of the power supply to avoid a short circuit.

Fourth Embodiment

Figure 5A:
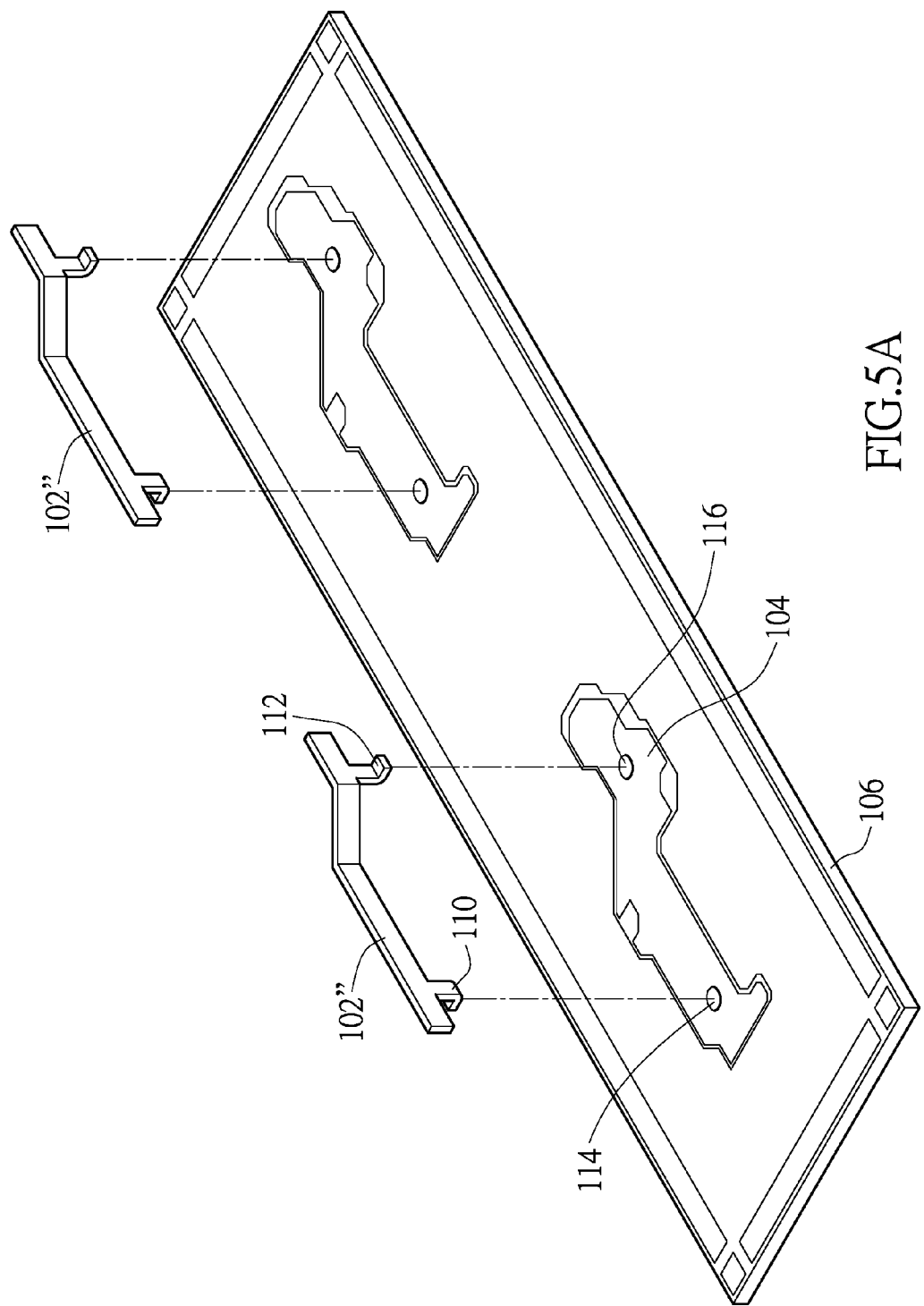
FIG. 5A shows an exploded view of the printed circuit board at an intermediate stage of an embodiment of the instant disclosure.

FIG. 5A shows an exploded view of a printed circuit board of the embodiment. FIG. 5B shows a cross section view of a printed circuit board at final stage of the embodiment. The difference between this embodiment and the first embodiment is that the conductive metal plate 102" is not parallel to the plate body 106 in this embodiment. As shown in FIG. 5A and FIG. 5B, the conductive metal plate 102" of the embodiment is perpendicular to the plate body 106. As well, the conductive metal plate 102" is a vertical type plate structure. The first fastening part 110 is fastened to the first hole 114 of the plate body 106, and the second fastening part 112 is fastened to the second hole 116 of the plate body 106. Next, referring to FIG. 5B, a furnace passing procedure is performed to form a metal layer 108. During this procedure, the metal layer 108 covers the surface of the conductive metal plate 102" and the conductive pattern 104. Therefore, a metal block comprising the metal layer 108, the conductive metal plate 102" and the conductive pattern 104 with sufficient height is formed. In an example, the metal block has height of about 1.5 mm~5 mm, so that the metal block can provide sufficiently low resistance to increase resistance efficiency of the printed circuit board 100. It is noted that if the printed circuit board 100 is used for a power supply, the metal layer 108 on the conductive metal plate 102" is required to be separated from the housing of the power supply to avoid a short circuit.

Possible Effectiveness of the Instant Embodiments

According to the description above, the instant disclosure has benefits as follows. The technique provided by the instant disclosure which comprises fastening a conductive metal plate to a conductive pattern and forming a metal layer thereon can form the metal layer comprising the conductive pattern, the conductive metal plate and the metal layer with sufficiently low resistance to increase resistance efficiency of the printed circuit board. In addition, some embodiments of the instant disclosure form an accommodating space between the conductive metal plate and the plate body. A furnace passing procedure is performed to form a metal layer. During this procedure, the metal layer fills the accommodating space between the conductive metal plate and the plate body due to capillarity, and the metal layer covers the surface of the conductive metal plate and the conductive pattern. Therefore, a metal block comprising the metal layer, the conductive metal plate and the conductive pattern with sufficient large thickness is formed. Accordingly, the metal block can provide sufficiently low resistance to increase resistance efficiency of the printed circuit board.

The figures and descriptions supra set forth illustrate the preferred embodiments of the instant disclosure; however, the characteristics of the instant disclosure are by no means restricted thereto. All changes, alterations, combinations or modifications conveniently considered by those skilled in the art are deemed to be encompassed within the scope of the instant disclosure delineated by the following claims.

What is claimed is:

1. A printed circuit board, comprising:
a plate body;
a conductive pattern disposed on the plate body;
a conductive metal plate having a first terminal and a second terminal, wherein the first terminal and the second terminal of the conductive metal plate are fixed to the plate body, and an accommodating space is between the conductive metal plate and the plate body; wherein the conductive metal plate is an arc structure, and a bottom of the conductive metal plate forms a curved surface above the accommodating space, so as to uplift the conductive metal plate away from the plate body; and
a metal layer flowing into the accommodating space as being heated, so as to cover the conductive metal plate and the conductive pattern, and the metal layer is filled into the accommodating space.

2. The printed circuit board as recited in claim 1, wherein the plate body has a first hole and a second hole, the first terminal of the conductive metal plate has a first fastening part, the second terminal of the conductive metal plate has a second fastening part, the first fastening part is fastened to the first hole, and the second fastening part is fastened to the second hole.

3. The printed circuit board as recited in claim 1, wherein the conductive metal plate is a copper member or an iron plate which is tinned at a surface thereon.

4. The printed circuit board as recited in claim 1, wherein the metal layer is formed of tin.

5. The printed circuit board as recited in claim 1, wherein the printed circuit board is used in a power supply, and the conductive metal plate and the metal layer thereon are separated from a housing of the power supply by a distance.

6. The printed circuit board as recited in claim 1, wherein a side of the conductive metal plate has a bumping structure partially protruded from a bottom side thereof, the bumping structure is disposed in the accommodating space and abuts against the plate body.

7. A printed circuit board, comprising:
- a plate body;
  - a conductive pattern disposed on the plate body;
  - a conductive metal plate having a first terminal and a second terminal, wherein the first terminal and the second terminal of the conductive metal plate are fixed to the plate body, and the conductive metal plate is perpendicular to the plate body, wherein the conductive metal plate has a bottom side disposed on the plate body and an erective side perpendicular to the plate body, wherein the erective side has a height larger than a width of the bottom side, so as to form a corner space defined by the erective side of the conductive metal plate and a surface of the plate body; and
  - a metal layer attaching the corner space as being heated, so as to cover the conductive metal plate and the conductive pattern.

8. The printed circuit board as recited in claim 7, wherein the plate body has a first hole and a second hole, the first terminal of the conductive metal plate has a first fastening part, the second terminal of the conductive metal plate has a second fastening part, the first fastening part is fastened to the first hole, and the second fastening part is fastened to the second hole.

9. A printed circuit board, comprising:
- a plate body;
  - a conductive pattern disposed on the plate body;
  - a conductive metal plate having a first terminal and a second terminal, wherein the first terminal and the second terminal of the conductive metal plate are fixed to the plate body, and an accommodating space is between the conductive metal plate and the plate body;
- wherein the conductive metal plate has a bumping structure partially protruded from a bottom side thereof, the bumping structure is disposed in the accommodating space and abuts against the plate body, so as to uplift the conductive metal plate away from the plate body; and
- a metal layer flowing into the accommodating space as being heated, so as to cover the conductive metal plate and the conductive pattern.

* * * * *